US011865701B2

(12) United States Patent
Hirose et al.

(10) Patent No.: US 11,865,701 B2
(45) Date of Patent: Jan. 9, 2024

(54) SUCTION METHOD

(71) Applicant: HAMAMATSU PHOTONICS K.K., Hamamatsu (JP)

(72) Inventors: Masaki Hirose, Hamamatsu (JP); Katsumi Shibayama, Hamamatsu (JP); Takashi Kasahara, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 906 days.

(21) Appl. No.: 16/763,888

(22) PCT Filed: Nov. 9, 2018

(86) PCT No.: PCT/JP2018/041728
§ 371 (c)(1),
(2) Date: May 13, 2020

(87) PCT Pub. No.: WO2019/098142
PCT Pub. Date: May 23, 2019

(65) Prior Publication Data
US 2021/0362351 A1    Nov. 25, 2021

(30) Foreign Application Priority Data

Nov. 17, 2017    (JP) .................................. 2017-221852

(51) Int. Cl.
*B25J 15/06* (2006.01)
*B65G 49/05* (2006.01)
(Continued)

(52) U.S. Cl.
CPC ......... *B25J 15/065* (2013.01); *B25J 15/0616* (2013.01); *B65G 49/05* (2013.01); *G02B 5/1847* (2013.01); *G02B 5/284* (2013.01)

(58) Field of Classification Search
CPC .... B65G 49/06; B65G 49/061; B25J 15/0616; B25J 15/0683; B25B 11/005; B25B 11/007; B23Q 3/088
See application file for complete search history.

(56) References Cited

U.S. PATENT DOCUMENTS 4,669,226 A * 6/1987 Mandler ............... B24B 13/005
                                                            451/384
2005/0018331 A1    1/2005 Pautet et al.
(Continued)

FOREIGN PATENT DOCUMENTS

CN        1178392 A      4/1998
CN      104600000 A      5/2015
(Continued)

OTHER PUBLICATIONS

International Preliminary Report on Patentability dated May 28, 2020 for PCT/JP2018/041728.

*Primary Examiner* — Tyrone V Hall, Jr.
(74) *Attorney, Agent, or Firm* — Faegre Drinker Biddle & Reath LLP

(57) ABSTRACT

A suction method is provided as a method of performing, by using a suction collet, suction of a Fabry-Perot interference filter including: a substrate; a laminated structure that is provided on the substrate and that includes a main surface facing a side opposite to the substrate; and a thinned portion that is located outside the laminated structure when viewed in a direction intersecting the main surface and that is recessed to a side of the substrate with respect to the main surface, the method including: a first step of arranging the suction collet so as to face the main surface; a second step of bringing the suction collet into contact with the Fabry-Perot interference filter after the first step; and a third step of suctioning the Fabry-Perot interference filter by using the suction collet after the second step.

7 Claims, 10 Drawing Sheets

(51) Int. Cl.
  *G02B 5/28*  (2006.01)
  *G02B 5/18*  (2006.01)

(56) References Cited

U.S. PATENT DOCUMENTS

| | | | | |
|---|---|---|---|---|
| 2006/0049564 A1* | 3/2006 | Tokudome | ............ | B25B 11/007 |
| | | | | 269/21 |
| 2006/0125257 A1* | 6/2006 | Liang | ................ | H05K 13/0447 |
| | | | | 294/189 |
| 2012/0274011 A1* | 11/2012 | Schilp | .................. | B25J 15/0616 |
| | | | | 269/21 |
| 2018/0065257 A1* | 3/2018 | Iwasaka | ............... | B25J 15/0683 |

FOREIGN PATENT DOCUMENTS

| | | | |
|---|---|---|---|
| CN | 105683725 | A | 6/2016 |
| JP | H07-014860 | A | 1/1995 |
| JP | H7-066268 | A | 3/1995 |
| JP | 2005-509897 | A | 4/2005 |
| JP | 2006-351848 | A | 12/2006 |
| JP | 2007-005336 | A | 1/2007 |
| JP | 2013-506154 | A | 2/2013 |
| KR | 10-2016-0082964 | | 7/2016 |
| TW | 201413852 | A | 4/2014 |
| TW | 201423834 | A | 6/2014 |
| TW | 201438127 | A | 10/2014 |
| TW | 201619029 | A | 6/2016 |
| TW | 201622052 | A | 6/2016 |
| TW | 201703183 | A | 1/2017 |
| WO | WO-03/042729 | A1 | 5/2003 |
| WO | WO-2011/036346 | A1 | 3/2011 |
| WO | WO-2015/064749 | A1 | 5/2015 |
| WO | WO 2015/064758 | A1 | 5/2015 |

\* cited by examiner

SUCTION METHOD

TECHNICAL FIELD

One aspect of the present invention relates to a suction method.

BACKGROUND ART

In the related art, a Fabry-Perot interference filter, which includes a substrate, a fixed mirror and a movable mirror facing each other via a gap on the substrate, and an intermediate layer defining the gap, is known (for example, refer to Patent Literature 1).

CITATION LIST

Patent Literature

Patent Literature 1: Japanese Unexamined Patent Publication No. 2013-506154

SUMMARY OF INVENTION

Technical Problem

In individual conveyance of Fabry-Perot interference filter chips as described above, the chips can be transported while being individually suctioned and held by using a suction collet, for example. At this time, an occurrence of contact of the suction collet with the movable mirror might lead to breakage of the movable mirror. In order to avoid such a problem, it is conceivable to suction a portion of the Fabry-Perot interference filter other than the movable mirror so as not to allow the suction collet to come in contact with the movable mirror. This case, however, can cause a new problem of difficulty in performing stable suction holding.

An object of one aspect of the present invention is to provide a suction method that enables stable suction holding while suppressing breakage of a Fabry-Perot interference filter.

Solution to Problem

A suction method according to one aspect of the present invention is a suction method of performing, by using a suction collet, suction of a Fabry-Perot interference filter including: a substrate; a laminated structure that is provided on the substrate and that includes a main surface facing a side opposite to the substrate; and a thinned portion that is located outside the laminated structure when viewed in a direction intersecting the main surface and that is recessed to a side of the substrate with respect to the main surface, the method including: a first step of arranging the suction collet so as to face the main surface; a second step of bringing the suction collet into contact with the Fabry-Perot interference filter after the first step; and a third step of suctioning the Fabry-Perot interference filter by using the suction collet after the second step, in which the suction collet includes: a main body having a surface provided with an opening for air intake; and a contact portion that is provided on the surface so as to protrude from the surface and that includes a contact surface, the laminated structure is provided with a membrane structure including a first mirror portion and a second mirror portion facing each other via a gap and in which a distance from each other is variable and including a portion of the main surface, in the first step, the suction collet is arranged such that the contact surface faces a bottom surface of the thinned portion, in the second step, the contact surface is brought into contact with the bottom surface while forming a space between the surface and the main surface, and in the third step, the inside of the space is exhausted by the air intake through the opening.

The Fabry-Perot interference filter as a suction object of the suction method has the membrane structure including the first mirror portion and the second mirror portion facing each other via the gap and in which the distance from each other is variable, formed corresponding to the laminated structure on the substrate. Therefore, for example, using a general suction tool in the suction and conveyance of the Fabry-Perot interference filter might cause breakage in the membrane structure by the contact. On the other hand, an attempt to perform suction at a portion other than the membrane structure in order to avoid this might lead to unstable suction and the holding.

In contrast, the present suction method performs the first step and the second step by which the contact portion protruding from the surface of the main body of the suction collet is brought into contact with the bottom surface of the thinned portion outside the laminated structure on the contact surface and together with this, a space is formed between the surface of the main body and the main surface of the laminated structure. Subsequently, in the third step, air intake is performed via the opening so that the space is exhausted to achieve suction. That is, according to the present suction method, the space on the main surface partially included in the membrane structure is exhausted to perform suction of the Fabry-Perot interference filter while supporting the Fabry-Perot interference filter by bringing the contact surface of the contact portion into contact with the Fabry-Perot interference filter outside the laminated structure. This makes it possible to perform stable suction and holding while suppressing breakage in the membrane structure at suction of the Fabry-Perot interference filter.

In the suction method according to one aspect of the present invention, the contact portion may extend so as to surround an area on the surface facing the space when viewed in a direction intersecting the surface, the contact portion may be provided with a communication portion that allows the space to communicate with the outside in a state where the contact surface may be in contact with the bottom surface, and in the third step, air may be introduced into the space through the communication portion by the air intake through the opening. In this case, since air is introduced from the outside into the space of intake through the communication portion, it is possible to achieve appropriate suction. This makes it possible to stably detach the Fabry-Perot interference filter when the suction is released.

In the suction method according to one aspect of the present invention, the contact portion may include a plurality of portions arranged to be spaced apart from each other so as to surround the area when viewed in the direction intersecting the surface, and the communication portion may be formed by a gap between the portions. In this case, the communication portion can be implemented with a simple configuration.

In the suction method according to one aspect of the present invention, the laminated structure may include an electrode terminal that is located outside the membrane structure when viewed in the direction intersecting the main surface and that protrudes from the main surface, and in the first step, the suction collet may be arranged such that the communication portion is set to a position corresponding to the electrode terminal outside the electrode terminal in the state where the contact surface is in contact with the bottom surface. In this case, at least a part of the airflow introduced into the space from the communication portion is directed in a direction away from the main surface when passing over the electrode terminals protruding from the main surface of the laminated structure, making it possible to reduce adverse effects of the airflow on the membrane structure.

In the suction method according to one aspect of the present invention, the laminated structure may have a rectangular shape when viewed in the direction intersecting the main surface, and in the first step, the suction collet may be arranged such that the communication portion is set to a position corresponding to each of the four corner portions of the rectangular shape of the laminated structure in the state where the contact surface is in contact with the bottom surface. This makes it possible to achieve stable intake.

In the suction method according to one aspect of the present invention, the contact portion may be integrally formed so as to continuously surround an area on the surface facing the space when viewed in a direction intersecting the surface. In this case, the space of intake is continuously surrounded by the contact portion, making it possible to achieve uniform intake within the space regardless of the position of the opening of the intake hole. This improves the degree of freedom of the position of the opening of the intake hole. In addition, the suction power can be increased without increasing the air intake.

In the suction method according to one aspect of the present invention, a plurality of the openings may be formed in the surface, and in the first step, the suction collet may be arranged such that the plurality of openings is symmetrically dispersed with respect to a center of the membrane structure when viewed in the direction intersecting the main surface. This makes it possible to achieve further stable suction and holding.

Advantageous Effects of Invention

According to one aspect of the present invention, it is possible to provide a suction method capable of performing stable suction holding while suppressing breakage of a Fabry-Perot interference filter.

DESCRIPTION OF EMBODIMENTS

Figure 1:
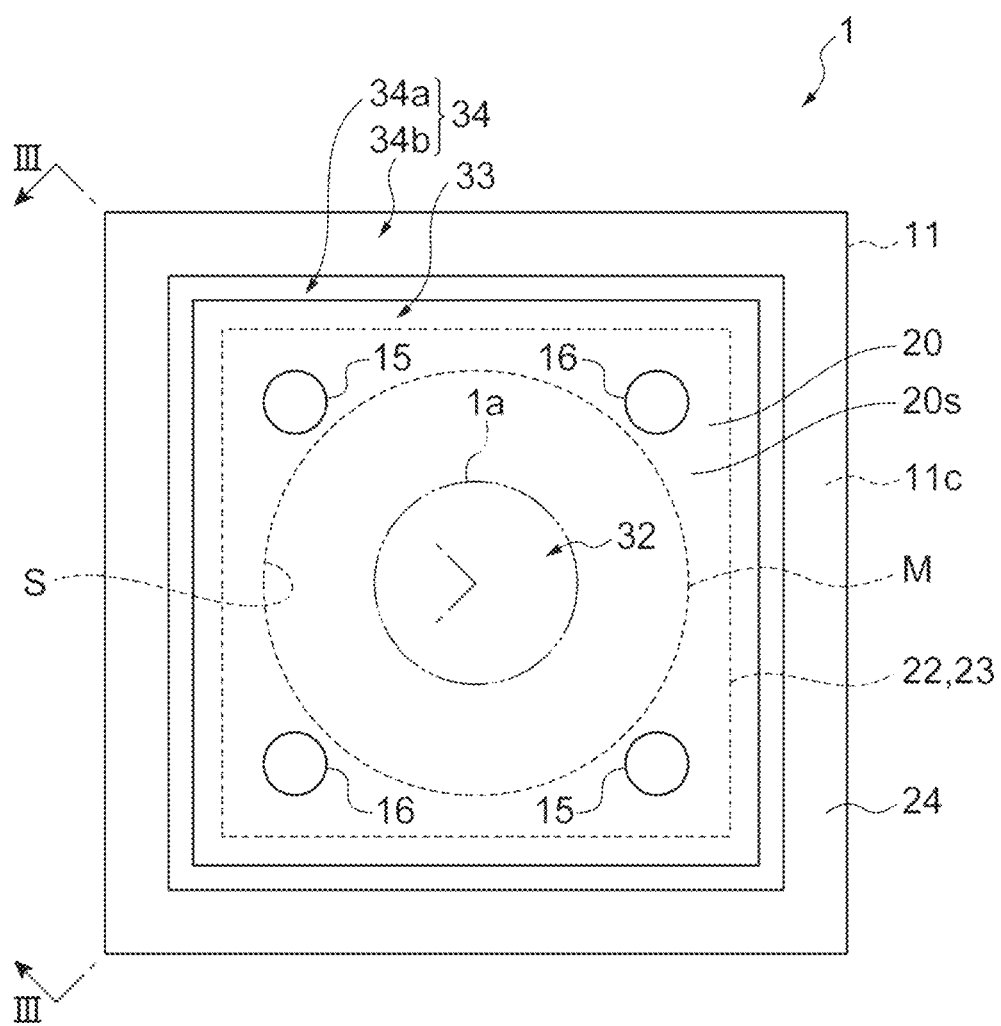
FIG. 1 is a plan view of a Fabry-Perot interference filter of the present embodiment.

Hereinafter, an embodiment will be described in detail with reference to the drawings. In each of the drawings, the same elements or corresponding elements will be denoted by the same reference numerals, and redundant description will be omitted in some cases. A suction method according to the present embodiment uses a suction collet to perform suction of a Fabry-Perot interference filter. Therefore, an embodiment of a Fabry-Perot interference filter as a suction object will be described first.

[Configuration of Fabry-Perot Interference Filter]

Figure 2:
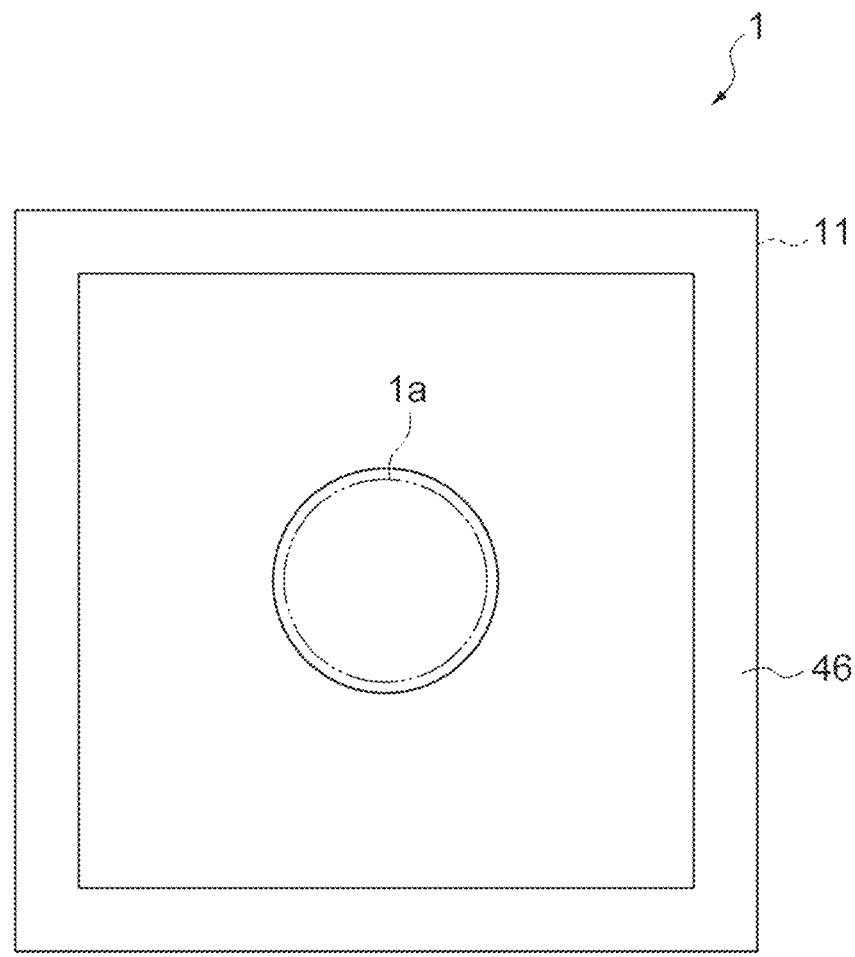
FIG. 2 is a bottom view of the Fabry-Perot interference filter illustrated in FIG. 1.
Figure 3:
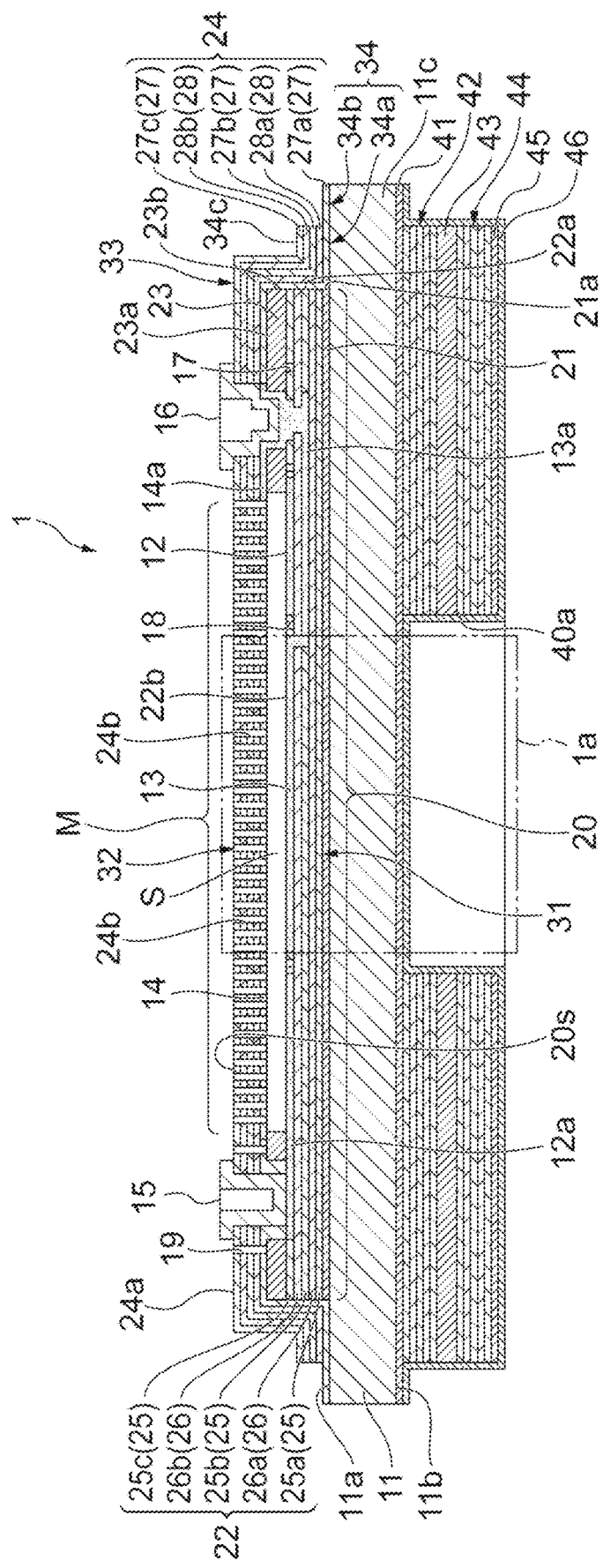
FIG. 3 is a cross-sectional view of the Fabry-Perot interference filter taken along line III-III in FIG. 1.

FIG. 1 is a plan view of a Fabry-Perot interference filter of the present embodiment. FIG. 2 is a bottom view of the Fabry-Perot interference filter illustrated in FIG. 1. FIG. 3 is a cross-sectional view of the Fabry-Perot interference filter taken along line III-III in FIG. 1.

As illustrated in FIGS. 1 to 3, a Fabry-Perot interference filter 1 includes a substrate 11. The substrate 11 has a first surface 11a and a second surface 11b opposite to the first surface 11a. On the first surface 11a, a reflection prevention layer 21, a first laminate 22, an intermediate layer 23, and a second laminate 24 are laminated in this order. A gap (air gap) S is defined between the first laminate 22 and the second laminate 24 by the frame-like intermediate layer 23. The first laminate 22, the intermediate layer 23, and a portion of the second laminate 24 located on the first laminate 22 when viewed in a direction intersecting (orthogonal to) the first surface 11a constitutes a laminated structure 20. The laminated structure 20 is provided on the first surface 11a of the substrate 11, and includes a main surface 20s facing the opposite side of the substrate 11. The main surface 20s is a portion of the surface 24a of the second laminate 24.

The shape and the positional relationship of each of portions when viewed in a direction perpendicular to the first surface 11a (plan view) are as follows. For example, an outer edge of the substrate 11 has a rectangular shape. The outer edge of the substrate 11 is aligned with an outer edge of the second laminate 24. An outer edge of the reflection prevention layer 21, an outer edge of the first laminate 22, and an outer edge of the intermediate layer 23 are aligned with each other. Therefore, the laminated structure 20 is also rectangular in plan view (when viewed in a direction intersecting (orthogonal to) the main surface 20s). The substrate 11 has an outer edge portion 11c positioned outside the outer edge of the intermediate layer 23 with respect to the center of the gap S. For example, the outer edge portion 11c has a frame shape and surrounds the intermediate layer 23 when viewed in a direction perpendicular to the first surface 11a.

The Fabry-Perot interference filter 1 transmits light having a predetermined wavelength through a light transmission region 1a defined in a center portion of the Fabry-Perot interference filter 1. For example, the light transmission region 1a is a columnar region. The substrate 11 is formed of silicon, quartz, glass, or the like, for example. When the substrate 11 is formed of silicon, the reflection prevention layer 21 and the intermediate layer 23 are formed of silicon oxide, for example. The thickness of the intermediate layer 23 is several tens of nm or more and several tens of μm or less, for example.

A portion corresponding to the light transmission region 1a in the first laminate 22 functions as a first mirror portion 31. The first mirror portion 31 is disposed on the first surface 11a via the reflection prevention layer 21. The first laminate 22 includes alternate laminations of each of a plurality of polysilicon layers 25 and each of a plurality of silicon nitride layers 26. In the present embodiment, a polysilicon layer 25a, a silicon nitride layer 26a, a polysilicon layer 25b, a silicon nitride layer 26b, and a polysilicon layer 25c are laminated on the reflection prevention layer 21 in this order. The optical thickness of each of the polysilicon layers 25 and the silicon nitride layers 26 included in the first mirror portion 31 can be set to an integral multiple of ¼ of a center transmission wavelength. The first mirror portion 31 may be directly disposed on the first surface 11a without interposing the reflection prevention layer 21.

The portion corresponding to the light transmission region 1a in the second laminate 24 functions as a second mirror portion 32. The second mirror portion 32 faces the first mirror portion 31 via the gap S on a side opposite to the substrate 11 with respect to the first mirror portion 31. The second laminate 24 is disposed on the first surface 11a via the reflection prevention layer 21, the first laminate 22, and the intermediate layer 23. The second laminate 24 includes alternate laminations of each of the plurality of polysilicon layers 27 and each of the plurality of silicon nitride layers 28. In the present embodiment, a polysilicon layer 27a, a silicon nitride layer 28a, a polysilicon layer 27b, a silicon nitride layer 28b, and a polysilicon layer 27c are laminated on the intermediate layer 23 in this order. The optical thickness of each of the polysilicon layers 27 and the silicon nitride layers 28 included in the second mirror portion 32 can be set to an integral multiple of ¼ of a center transmission wavelength.

In the first laminate 22 and the second laminate 24, silicon oxide layers may be used in place of the silicon nitride layers. In addition, examples of the material applicable for each of layers forming the first laminate 22 and the second laminate 24 include titanium oxide, tantalum oxide, zirconium oxide, magnesium fluoride, aluminum oxide, calcium fluoride, silicon, germanium, zinc sulfide, or the like. Here, the surface of the first mirror portion 31 on the gap S side (surface of the polysilicon layer 25c) and the surface of the second mirror portion 32 on the gap S side (surface of the polysilicon layer 27a) directly face each other via the gap S. Note that an electrode layer a protective layer, or the like (not forming a mirror) may be formed on the surface of the first mirror portion 31 on the gap S side and on the surface of the second mirror portion 32 on the gap S side. In this case, the first mirror portion 31 and the second mirror portion 32 face each other via the gap S with the presence of these interposed layers. In other words, even in such a case, a facing configuration between the first mirror portion 31 and the second mirror portion 32 via the gap S can be achieved.

A plurality of through-holes 24b ranging from a surface 24a (main surface 20s of the laminated structure 20) of the second laminate 24 on a side opposite to the intermediate layer 23 to the gap S is formed at a portion of the second laminate 24 corresponding to the gap S. The plurality of through-holes 24b is formed so as not to substantially influence the function of the second mirror portion 32. The plurality of through-holes 24b is used for forming the gap S by removing a portion of the intermediate layer 23 through etching.

In addition to the second mirror portion 32, the second laminate 24 further includes a covering portion 33 and a peripheral edge portion 34. The second mirror portion 32, the covering portion 33, and the peripheral edge portion 34 are integrally formed to have a portion of a same laminated structure and to be continuous to each other. The covering portion 33 surrounds the second mirror portion 32 when viewed in a direction perpendicular to the first surface 11a. The covering portion 33 covers a surface 23a of the intermediate layer 23 on a side opposite to the substrate 11, a side surface 23b of the intermediate layer 23 (outer side surface, that is, a side surface on a side opposite to the gap S side), a side surface 22a of the first laminate 22, and a side surface 21a of the reflection prevention layer 21, so as to reach the first surface 11a. That is, the covering portion 33 covers the outer edge of the intermediate layer 23, the outer edge of the first laminate 22, and the outer edge of the reflection prevention layer 21.

The peripheral edge portion 34 surrounds the covering portion 33 when viewed in a direction perpendicular to the first surface 11a. The peripheral edge portion 34 is positioned on the first surface 11a in the outer edge portion 11c. The outer edge of the peripheral edge portion 34 is aligned with the outer edge of the substrate 11 when viewed in a direction perpendicular to the first surface 11a.

The peripheral edge portion 34 is thinned along an outer edge of the outer edge portion 11c. That is, the portion along the outer edge of the outer edge portion 11c in the peripheral edge portion 34 is thinner compared to other portions excluding the portion along the outer edge of the peripheral edge portion 34. In the present embodiment, a portion of the polysilicon layer 27 and the silicon nitride layer 28 included in the second laminate 24 has been removed, thereby thinning the peripheral edge portion 34. The peripheral edge portion 34 includes a non-thinned portion 34a continuous to the covering portion 33, and a thinned portion 34b surrounding the non-thinned portion 34a. In the thinned portion 34b, the polysilicon layer 27 and the silicon nitride layer 28 are removed excluding the polysilicon layer 27a directly provided on the first surface 11a.

In this manner, the Fabry-Perot interference filter 1 further includes, in addition to the laminated structure 20, the thinned portion 34b that is located outside the laminated structure 20 and recessed to the substrate 11 side with respect to the main surface 20s when viewed in the direction intersecting (orthogonal to) the main surface 20s. The thinned portion 34b is formed in a loop shape (here, a rectangular loop shape) so as to surround the laminated structure 20 when viewed in the direction intersecting (orthogonal to) the main surface 20s. The thinned portion 34b is used, for example, when cutting a wafer in which a plurality of regions corresponding to the Fabry-Perot interference filter 1 is formed, for each of the Fabry-Perot interference filters 1. The thinned portion 34b is formed by etching a laminated structure for the second laminate 24.

The height of a surface 34c of the non-thinned portion 34a on a side opposite to the substrate 11 from the first surface 11a is lower than the height of the surface 23a of the intermediate layer 23 from the first surface 11a. The height of the surface 34c of the non-thinned portion 34a from the first surface 11a ranges from 100 nm to 5000 nm, for example. The height of the surface 23a of the intermediate layer 23 from the first surface 11a is a height greater than the height of the surface 34c of the non-thinned portion 34a from the first surface 11a in a range from 500 nm to 20000 nm, for example. The width of the thinned portion 34b (distance between an outer edge of the non-thinned portion 34a and the outer edge of the outer edge portion 11c) is 0.01 times the thickness of the substrate 11, or more. The width of the thinned portion 34b ranges from 5 μm to 400 μm, for example. The thickness of the substrate 11 ranges from 500 μm to 800 μm, for example.

A first electrode 12 is formed in the first mirror portion 31 so as to surround that the light transmission region 1a. The first electrode 12 is formed by doping impurities into the polysilicon layer 25c to achieve low resistivity. A second electrode 13 is formed in the first mirror portion 31 so as to surround the light transmission region 1a. The second electrode 13 is formed by doping impurities into the polysilicon layer 25c to achieve low resistivity. Note that although the second electrode 13 can be sized to include the entire light transmission region 1a, the second electrode 13 may be set to substantially the same size as that of the light transmission region 1a.

A third electrode 14 is formed in the second mirror portion 32. The third electrode 14 faces the first electrode 12 and the second electrode 13 via the gap S. The third electrode 14 is formed by doping impurities into the polysilicon layer 27a to achieve low resistivity.

A pair of terminals (electrode terminals) 15 is provided to face each other across the light transmission region 1a. Each of the terminals 15 is disposed in a through-hole ranging from the surface 24a of the second laminate 24 (main surface 20s of the laminated structure 20) to the first laminate 22. Each of the terminals 15 is electrically connected to the first electrode 12 through wiring 12a. For example, the terminal 15 is formed from a metal film of aluminum, an alloy, or the like, thereof.

A pair of terminals (electrode terminals) 16 is provided to face each other across the light transmission region 1a. Each of the terminals 16 is disposed in a through-hole ranging from the surface 24a of the second laminate 24 (main surface 20s of the laminated structure 20) to the first laminate 22. Each of the terminals 16 is electrically connected to the second electrode 13 through wiring 13a and is electrically connected to the third electrode 14 through wiring 14a. For example, the terminals 16 are formed with a metal film of aluminum, an alloy thereof, or the like. The facing direction of the pair of terminals 15 and the facing direction of the pair of terminals 16 are orthogonal to each other (refer to FIG. 1).

Trenches 17 and 18 are provided on a surface 22b of the first laminate 22. The trench 17 annularly extends to surround a connection with respect to the terminals 16 in the wiring 13a. The trench 17 electrically insulates the first electrode 12 and the wiring 13a from each other. The trench 18 annularly extends along an inner edge of the first electrode 12. The trench 18 electrically insulates the first electrode 12 and a region of the first electrode 12 on an inner side (second electrode 13). Each of the regions in the trenches 17 and 18 may be an insulating material or a gap.

A trench 19 is provided on the surface 24a of the second laminate 24 (main surface 20s of the laminated structure 20). The trench 19 annularly extends to surround the terminals 15. The trench 19 electrically insulates the terminals 15 and the third electrode 14 from each other. The region inside the trench 19 may be an insulating material or a gap.

The second surface 11b of the substrate 11 includes layers of a reflection prevention layer 41, a third laminate 42, an intermediate layer 43, and a fourth laminate 44 laminated in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 with respect to the substrate 11. The reflection prevention layer 41, the third laminate 42, the intermediate layer 43, and the fourth laminate 44 have a function of suppressing warpage of the substrate 11.

The third laminate 42, the intermediate layer 43, and the fourth laminate 44 are thinned along the outer edge of the outer edge portion 11c. That is, the portion along the outer edge of the outer edge portion 11c in the third laminate 42, the intermediate layer 43, and the fourth laminate 44 is thinner compared to other portions excluding the portion along the outer edge in the third laminate 42, the intermediate layer 43, and the fourth laminate 44. In the present embodiment, the third laminate 42, the intermediate layer 43, and the fourth laminate 44 are thinned by removing the entirety of the third laminate 42, the intermediate layer 43, and the fourth laminate 44 in a part overlapping the thinned portion 34b when viewed in a direction perpendicular to the first surface 11a.

The third laminate 42, the intermediate layer 43, and the fourth laminate 44 has an opening 40a provided to include the light transmission region 1a. The opening 40a has a diameter approximately the same as the size of the light transmission region 1a. The opening 40a opens on a light emission side, having a bottom surface of the opening 40a reaching the reflection prevention layer 41.

A light shielding layer 45 is formed on a surface of the fourth laminate 44 on the light emission side. For example, the light shielding layer 45 is formed of aluminum. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is formed of aluminum oxide. An optical influence due to the protective layer 46 can be disregarded by causing the thickness of the protective layer 46 to range from 1 nm to 100 nm (approximately 30 nm, for example).

In the Fabry-Perot interference filter 1 configured as described above, when a voltage is applied between the first electrode 12 and the third electrode 14 via the pair of terminals 15 and 16, an electrostatic force corresponding to the voltage is generated between the first electrode 12 and the third electrode 14. The second mirror portion 32 is attracted to the first mirror portion 31 side secured to the substrate 11 due to the electrostatic force, and the distance between the first mirror portion 31 and the second mirror portion 32 is adjusted. In this manner, in the Fabry-Perot interference filter 1, the distance between the first mirror portion 31 and the second mirror portion 32 is variable.

The wavelength of light transmitted through the Fabry-Perot interference filter 1 depends on the distance between the first mirror portion 31 and the second mirror portion 32 in the light transmission region 1a. Therefore, the wavelength of transmitted light can be appropriately selected by adjusting the voltage to be applied between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1a.

In the Fabry-Perot interference filter 1, for example, a spectroscopic spectrum can be obtained by detecting light transmitted through the light transmission region 1a of the Fabry-Perot interference filter 1 using a light detector while the voltage to be applied to the Fabry-Perot interference filter 1 is changed (that is, while the distance between the first mirror portion 31 and the second mirror portion 32 is changed in the Fabry-Perot interference filter 1).

In this manner, the laminated structure 20 includes the membrane structure M having the first mirror portion 31 and the second mirror portion 32 facing each other via the gap S and in which a distance from each other is variable and having a portion of the main surface 20s (here, a circular area on the center side). The membrane structure M is a portion of the laminated structure 20 not overlapping the intermediate layer 23 when viewed in the direction intersecting (orthogonal to) the main surface 20s. That is, the outer shape of the membrane structure M when viewed in the direction intersecting (orthogonal to) the main surface 20s is defined by an inner edge of the intermediate layer 23, illustrated here in a circular shape (refer to FIG. 1).

In the present embodiment, the membrane structure M is located between the pair of terminals 15, between the pair of terminals 16, and between the terminal 15 and the terminal 16 when viewed in the direction intersecting (orthogonal to) the main surface 20s. In other words, in this example, the pair of terminals 15, the pair of terminals 16, and the terminals 15-16 are each arranged to face each other across the membrane structure M. The terminals 15 and 16 are located outside the membrane structure M when viewed in the direction intersecting (orthogonal to) the main surface 20s. As an example, the terminals 15 and 16 are provided at each of four corner portions of the rectangular laminated structure 20 when viewed in the direction intersecting (orthogonal to) the main surface 20s. The terminals 15 are 16 protrude from the main surface 20s.

[Configuration of Suction Collet]

Subsequently, a suction collet for suctioning the above Fabry-Perot interference filter 1 will be described. The suction collet according to the present embodiment is applicable in a case, for example, where one chip is picked up from a chip group of a Fabry-Perot interference filter 1 manufactured by cutting a wafer so as to be conveyed to a predetermined position, or where a Fabry-Perot interference filter 1 placed at a predetermined position is picked up and further conveyed to an installation location.

Figure 4:
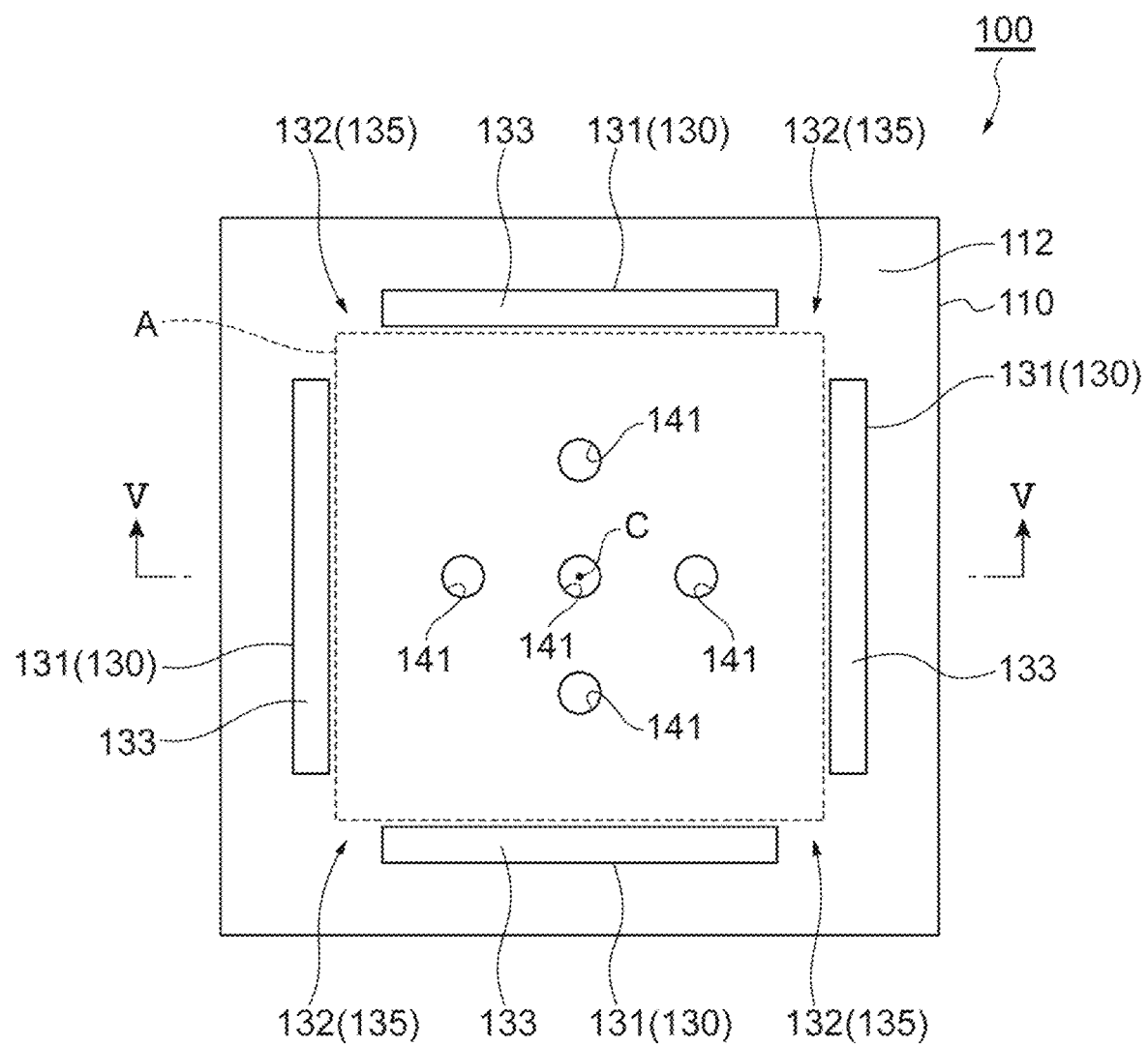
FIG. 4 is a view illustrating a suction collet according to the present embodiment.
Figure 5:
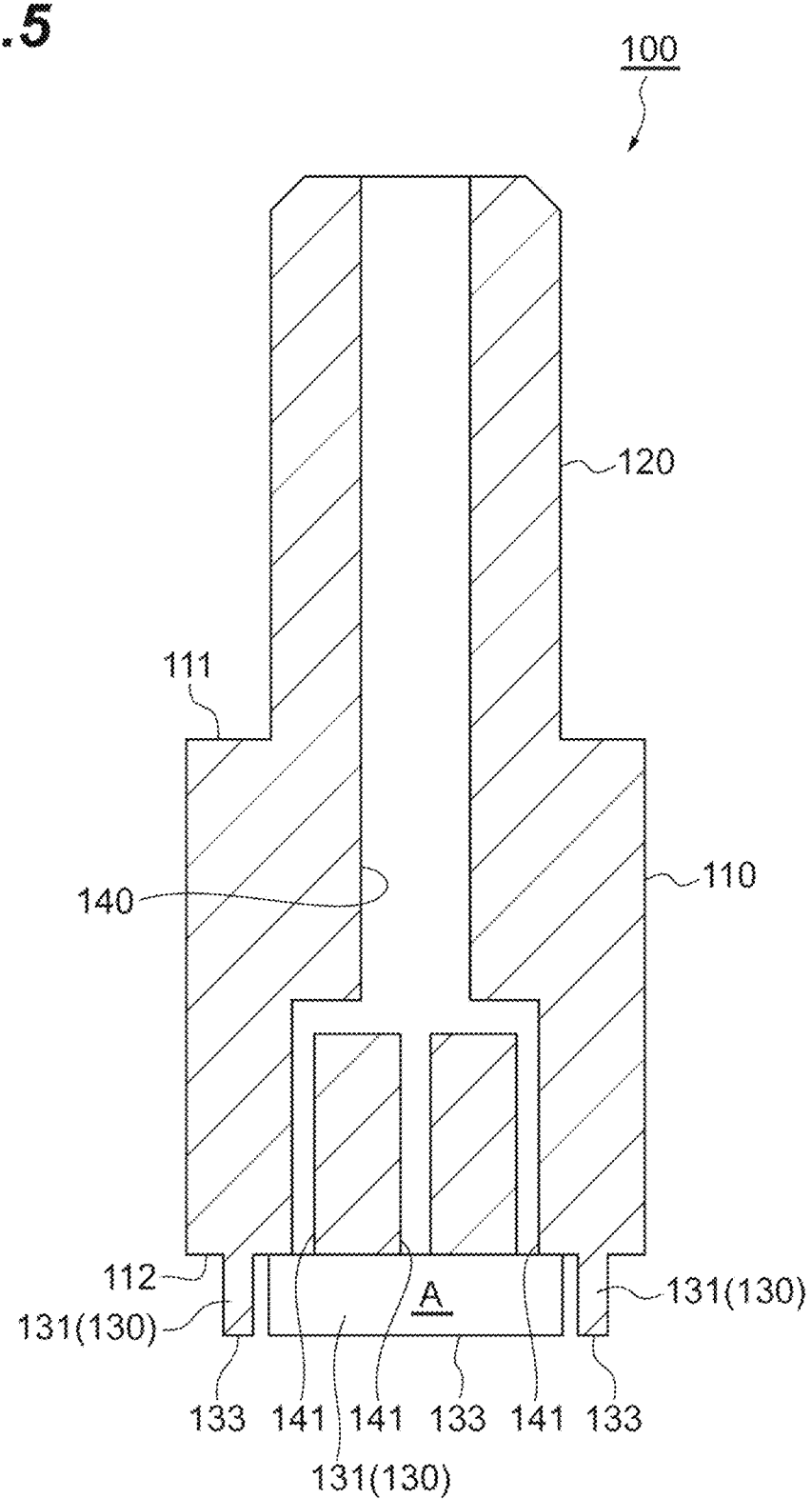
FIG. 5 is a view illustrating a suction collet according to the present embodiment.

FIGS. 4 and 5 are views each illustrating a suction collet according to the present embodiment. FIG. 4 is a bottom view, and FIG. 5 is a cross-sectional view taken along line V-V of FIG. 4. As illustrated in FIGS. 4 and 5, a suction collet 100 includes a main body 110, an extending portion 120, and a contact portion 130. Here, the main body 110, the extending portion 120, and the contact portion 130 are formed integrally with each other, but may be formed separately from each other to be joined thereafter.

The main body 110 has a rectangular parallelepiped shape, for example. The main body 110 has a surface 111 and a surface 112 opposite to the surface 111. The extending portion 120 is provided on the surface 111 so as to protrude from the surface 111, and extends in a direction intersecting the surface 111. The extending portion 120 has a columnar shape having a diameter shorter than the length of one side of the main body 110 when viewed in the direction intersecting the surface 111 and is disposed inside the outer edge of the surface 111. This configuration gives the surface 111 an annular shape in which an outer shape is a rectangular shape and an inner edge has a circular shape. The extending portion 120 is applicable in connecting the suction collet 100 to a device (not illustrated) for driving the suction collet 100.

The surface 112 has a shape corresponding to the outer shape of the Fabry-Perot interference filter 1 and an example of this is rectangular (for example, square). The contact portion 130 is provided on the surface 112 so as to protrude from the surface 112. The contact portion 130 is a portion that comes into contact with the Fabry-Perot interference filter 1 at suction of the Fabry-Perot interference filter 1. An intake hole 140 is provided for the main body 110 and the extending portion 120 so as to extend over the entire length of the main body 110 and the extending portion 120. The intake hole 140 opens on the surface 112 and on an end of the extending portion 120 opposite to the main body 110. The intake hole 140 can be connected to an intake device (not illustrated) such as a pump via an opening on the extending portion 120 side. In addition, the intake hole 140 need not be provided to extend over the entire length of the main body 110 and the extending portion 120. For example, the intake hole 140 may form an opening up to the outer side surface (the surface intersecting the surface 112) of the main body 110. In this case, the intake hole 140 can be connected to the intake device via the opening on the outer side surface of the main body 110.

The contact portion 130 includes a plurality (here, four) portions 131. Each of the portions 131 is formed in a long rectangular parallelepiped shape. The portions 131 are arranged such that their longitudinal directions follow different sides of a rectangular shape. Furthermore, a gap 132 is formed between the portions 131. Here, the gap 132 is set at a position corresponding to the four corner portions of the rectangular shape. The intake hole 140 opens in an area A surrounded by the portions 131 (the contact portion 130) on the surface 112 when viewed in a direction intersecting (orthogonal to) the surface 112. Here, a plurality of (here, five) openings 141 of the intake holes 140 is formed in the surface 112. The intake holes 140 extend from each of the plurality of openings 141 toward the surface 111, while being connected to be integrated into one hole in the main body 110 to reach the extending portion 120. Therefore, there is one opening of the intake hole 140 on the extending portion 120 side.

Figure 6:
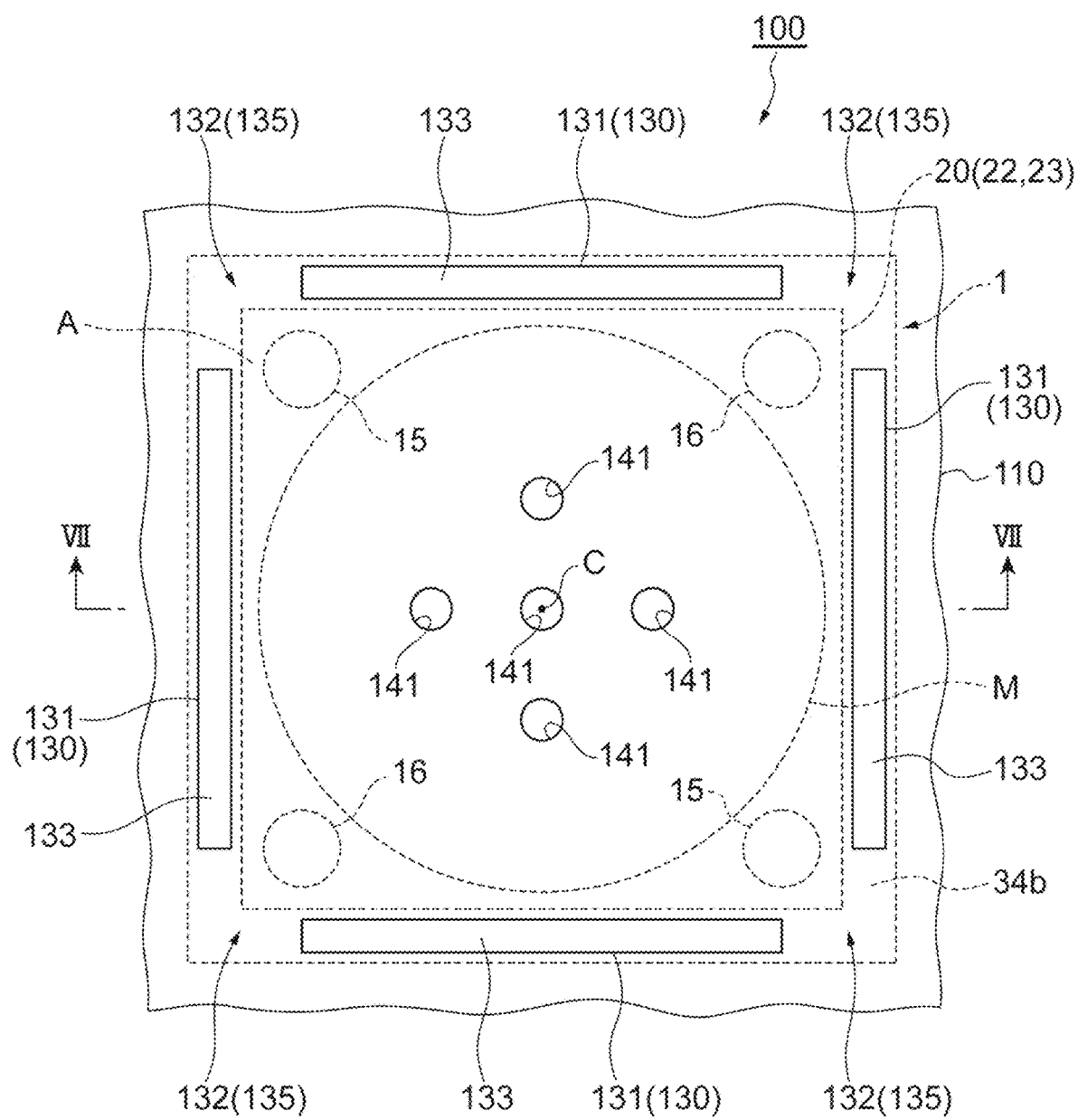
FIG. 6 is a schematic view illustrating a state in which the suction collet illustrated in FIGS. 4 and 5 suctions the Fabry-Perot interference filter.
Figure 7:
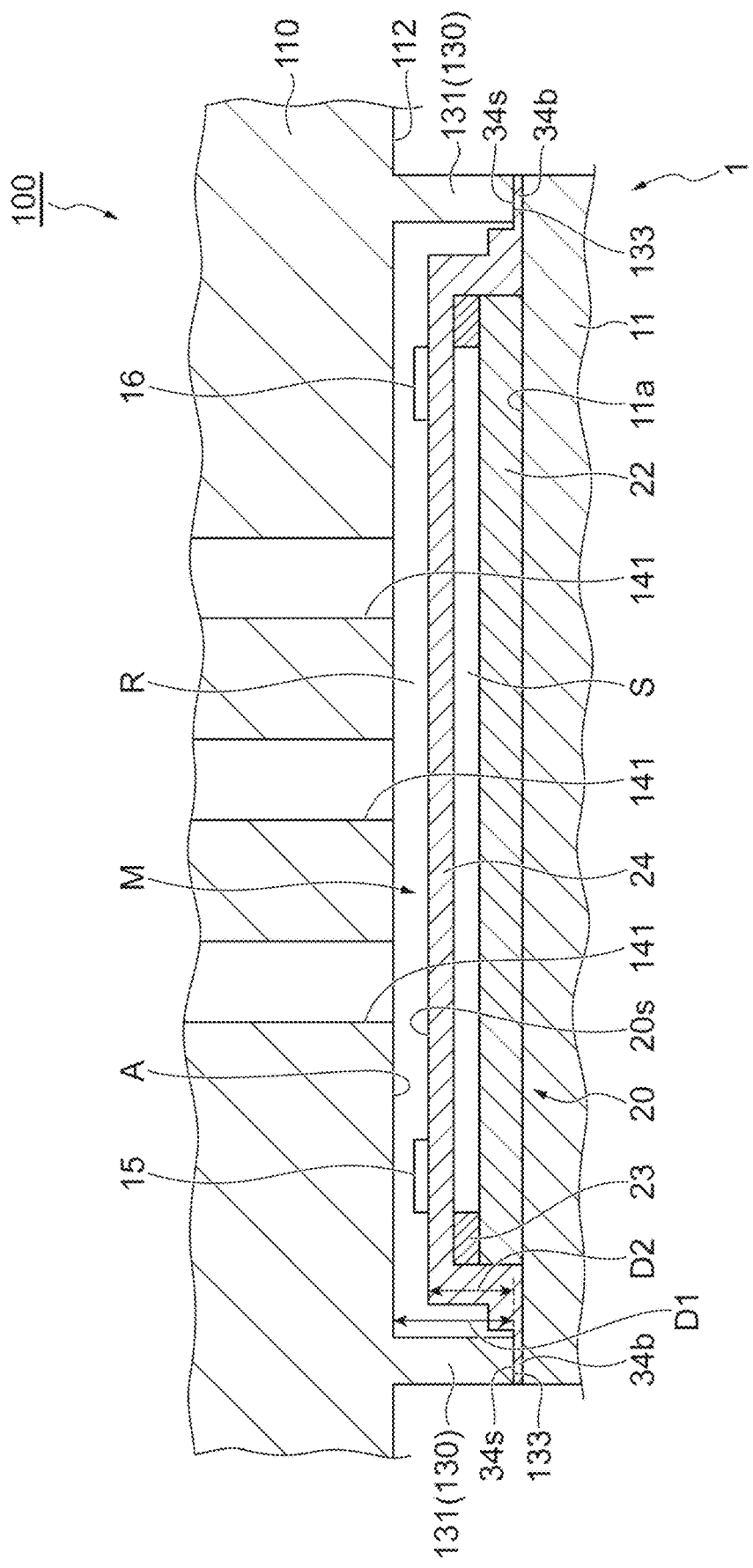
FIG. 7 is a schematic view illustrating a state in which the suction collet illustrated in FIGS. 4 and 5 suctions the Fabry-Perot interference filter.

FIGS. 6 and 7 are schematic views illustrating a state in which the suction collet illustrated in FIGS. 4 and 5 suctions the Fabry-Perot interference filter. FIG. 6 is a bottom view (view from the surface 112 side), illustrating a portion of the Fabry-Perot interference filter in a simplified manner by broken lines. FIG. 7 is a schematic cross-sectional view taken along line VII-VII of FIG. 6. FIG. 7 omits illustrations of the layer structures of the first laminate 22 and the second laminate 24, electrodes, or the like.

As illustrated in FIGS. 6 and 7, the contact portion 130 has a contact surface 133 that comes in contact with a bottom surface (surface) 34s of the thinned portion 34b of the Fabry-Perot interference filter 1. Here, the contact surface 133 is a surface opposite to the surface 112 in each of the portions 131 of the contact portion 130. A distance D1 between the surface 112 and the contact surface 133 (height of the contact portion 130 from the surface 112) is greater than a distance D2 between the bottom surface 34s and the main surface 20s of the laminated structure 20. With this configuration, in a state where the contact surface 133 is in contact with the bottom surface 34s (hereinafter, sometimes simply referred to as a "contact state"), the contact portion 130 maintains a state in which the surface 112 and the main surface 20s (and the top surfaces of the terminals 15 and 16) are spaced away from each other, so as to form a space R between the surface 112 and the main surface 20s.

The contact portion 130 extends so as to surround the laminated structure 20 when viewed in the direction intersecting (orthogonal to) the surface 112 in a contact state. More specifically, here, each of the portions 131 of the contact portion 130 is arranged along the outer edge of the laminated structure 20 in the contact state. Therefore, the above-described area A is a rectangular area of the surface 112 that faces the main surface 20s in the contact state and faces the space R. In the contact state, the surface 112 and the main surface 20s are substantially parallel to each other.

The opening 141 of the intake hole 140 on the surface 112 is formed in this area A. Here, the openings 141 are arranged to be symmetrically dispersed with respect to a center C of the area A when viewed in the direction intersecting (orthogonal to) the surface 112. As an example, one opening 141 is arranged at the center C, and four openings 141 are arranged at positions corresponding to individual corner portions of the square centered on the center C. With arrangement of the suction collet 100 in which the center of the membrane structure M and the center C of the area A are aligned with each other when viewed in the direction intersecting (orthogonal to) the main surface 20s, the plurality of openings 141 will be symmetrically dispersed also with respect to the center of the membrane structure M when viewed in the direction intersecting (orthogonal to) the main surface 20s.

The contact portion 130 is provided with a communication portion 135 so as to allow the space R to communicate with the outside in the contact state. With this configuration, the space R will not be sealed even in the contact state. The communication portion 135 is formed by the gap 132 between the portions 131 of the contact portion 130 (here, formed as the gap 132). Therefore, the four communication portions 135 here are formed at positions corresponding to the four corner portions of the region in each of which the contact portion 130 extending in a rectangular shape is arranged. In the contact state, the corner portions of the contact portion 130 and the corner portions of the laminated structure 20 correspond to each other. Therefore, each of the communication portions 135 is disposed at a position corresponding to the terminals 15 and 16 on a one-to-one basis outside the terminals 15 and 16 on the corner portions of the laminated structure 20 in the contact state. More specifically, a pair of communication portions 135 is disposed outside the terminals 15 with respect to the center C of the area A on an axis passing through the pair of terminals 15, while another pair of communication portions 135 is disposed outside the terminals 16 with respect to the center C of the area A on an axis passing through the pair of terminals 16. In addition, arranging the communication portion 135 outside the terminals 15 and 16 in the contact state means arranging the communication portion 135 on the side opposite to the gap S (that is, the membrane structure M) in the terminals 15 and 16. That is, when viewed in the direction intersecting (orthogonal to) the main surface 20s, the gap S (that is, the membrane structure M) side of the terminals 15 and 16 is defined as the inner side of the terminals 15 and 16, while its opposite side is defined as the outer side of the terminals 15 and 16.

Embodiment of Suction Method

Figure 8:
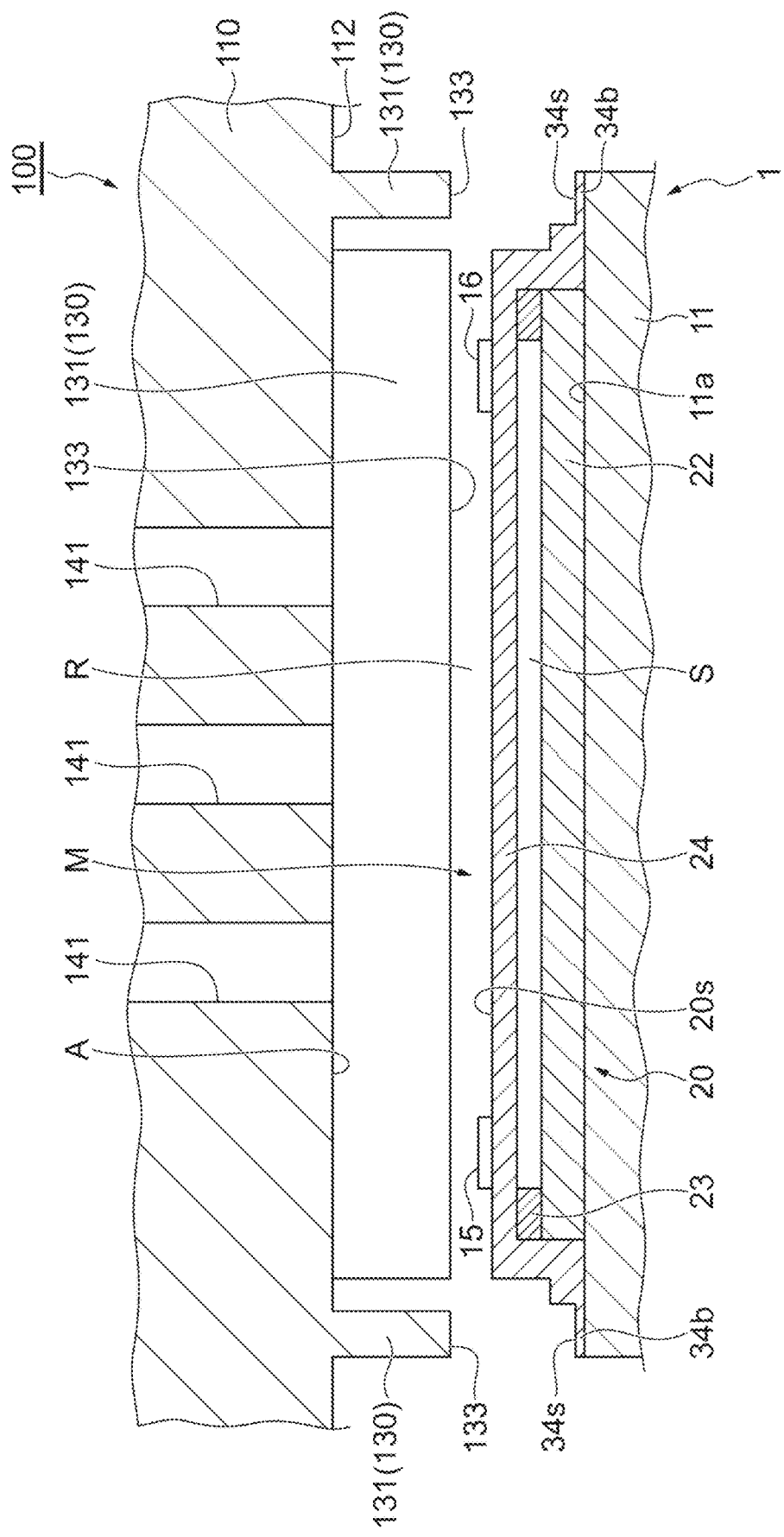
FIG. 8 is a schematic cross-sectional view illustrating steps of a suction method according to the present embodiment.

Subsequently, an embodiment of a suction method implemented for the suction of the Fabry-Perot interference filter 1 by using the suction collet 100 will be described. FIG. 8 is a schematic cross-sectional view illustrating steps of the suction method according to the present embodiment. FIG. 8 omits illustrations of the layer structures of the first laminate 22 and the second laminate 24, electrodes, or the like, similarly to FIG. 7. As illustrated in FIG. 8, in this method, the suction collet 100 is first disposed on the Fabry-Perot interference filter 1 (first step). In the first step, the suction collet 100 is arranged such that the surface 112 of the main body 110 of the suction collet 100 faces the main surface 20s of the laminated structure 20 (and the membrane structure M) and such that each of the contact surfaces 133 faces the bottom surface 34s of the thinned portion 34b.

Subsequently, as illustrated in FIG. 7, the suction collet 100 is brought into contact with the Fabry-Perot interference filter 1 (second step). In the second step, the contact surface 133 is brought into contact with the bottom surface 34s. As described above, the distance D1 between the surface 112 and the contact surface 133 (height of the contact portion 130 from the surface 112) is greater than the distance D2 between the bottom surface 34s and the main surface 20s of the laminated structure 20. Therefore, when the contact surface 133 is brought into contact with the bottom surface 34s, the state where the surface 112 and the main surface 20s are spaced apart from each other is maintained, and the space R is formed between the surface 112 and the main surface 20s. That is, in the second step, the contact surface 133 is brought into contact with the bottom surface 34s while forming the space R between the surface 112 and the main surface 20s.

At this time, as illustrated in FIG. 6, the communication portions 135 are located at positions corresponding to the terminals 15 and 16 outside the terminals 15 and 16 in the contact state. In addition, the communication portion 135 is located, in the contact state, at a position corresponding to each of the four corner portions of the rectangular shape of the laminated structure 20. Furthermore, the plurality of openings 141 is arranged so as to be symmetrically dispersed with respect to the center of the membrane structure M when viewed in the direction intersecting the main surface 20s. These arrangement relationships are implemented by the structure of the suction collet 100 and the relative arrangement in the first step. That is, in the first step, the communication portions 135 are arranged so as to be located at positions corresponding to the terminals 15 and 16 outside the terminals 15 and 16 in the contact state, as well as being located at positions corresponding to the four corner portions of the rectangular shape of the laminated structure 20. Furthermore, in the first step, the center C of the area A and the center of the membrane structure M are arranged so as to be substantially aligned with each other as described above, whereby the suction collet 100 will be arranged such that the plurality of openings 141 is symmetrically dispersed with respect to the center of the membrane structure M when viewed in the direction intersecting the main surface 20s.

In the subsequent step, the Fabry-Perot interference filter 1 is suctioned by the suction collet 100 (third step). In the third step, the space R is exhausted by air intake through the opening 141. With this procedure, the state in which the Fabry-Perot interference filter 1 is suction-held by the suction collet 100 is maintained until the air intake through the opening 141 is released. The space R communicates with the outside via the communication portion 135. Therefore, in the third step, air is introduced into the space R through the communication portion 135 by the air intake through the opening 141. Thereafter, as necessary, the Fabry-Perot interference filter 1 is conveyed together with the suction collet 100 to a predetermined position, and then the air intake through the opening 141 is released so as to detach the Fabry-Perot interference filter 1 from the suction collet 100.

As described above, the Fabry-Perot interference filter 1 as a suction object of the suction method according to the present embodiment has the membrane structure M including the first mirror portion 31 and the second mirror portion 32 facing each other via the gap S and in which the distance from each other is variable, formed corresponding to the laminated structure 20 on the substrate 11. Therefore, for example, using a general suction tool in the suction and conveyance of the Fabry-Perot interference filter 1 might cause breakage in the membrane structure M by the contact. On the other hand, an attempt to perform suction at a portion other than the membrane structure M in order to avoid this might lead to unstable suction and the holding.

In contrast, the present suction method performs the first step and the second step by which the contact portion 130 protruding from the surface 112 of the main body 110 of the suction collet 100 is brought into contact with the bottom surface 34s of the thinned portion 34b outside the laminated structure 20 on the contact surface 133 and together with this, the space is formed between the surface 112 of the main body 110 and the main surface 20s of the laminated structure 20. Subsequently, in the third step, air intake is performed via the opening 141 so that the space R is exhausted to achieve suction. That is, according to the present suction method, the space R on the main surface 20s partially included in the membrane structure M is exhausted to perform suction of the Fabry-Perot interference filter 1 while bringing the contact surface 133 of the contact portion 130 into contact with the Fabry-Perot interference filter 1 outside the laminated structure 20. This makes it possible to perform stable suction and holding while suppressing breakage in the membrane structure M at suction of the Fabry-Perot interference filter 1.

Furthermore, the contact portion 130 extends so as to surround the area A on the surface 112 facing the space R when viewed in the direction intersecting the surface 112. The contact portion 130 is provided with the communication portion 135 that allows the space R to communicate with the outside in a state where the contact surface 133 is in contact with the bottom surface 34s. Subsequently, in the third step, air is introduced into the space R through the communication portion 135 by the air intake through the opening 141. With this configuration, since air is introduced from the outside into the space R of intake through the communication portion 135, it is possible to achieve appropriate suction. This makes it possible to stably detach the Fabry-Perot interference filter 1 when the suction is released.

Furthermore, the contact portion 130 includes the plurality of portions 131 arranged to be spaced apart from each other so as to surround the area A when viewed in the direction intersecting the surface 112. The communication portion 135 is formed by the gap 132 between the portions 131. In this manner, the communication portion 135 is formed with a simple configuration.

Furthermore, the laminated structure 20 is provided with terminals 15 and 16 that are located outside the membrane structure M when viewed in the direction intersecting the main surface 20s and protrude from the main surface 20s. In the first step, the suction collet 100 is arranged such that the communication portion 135 is located at a position corresponding to the terminals 15 and 16 outside the terminals 15 and 16 with respect to the center C of the area A in a state where the contact surface 133 is in contact with the bottom surface 34s. Because of this, at least a part of the airflow introduced into the space R from the communication portion 135 is directed in a direction away from the main surface 20s when passing over the terminals 15 and 16 protruding from the main surface 20s of the laminated structure 20. This can reduce the adverse effects of the airflow on the membrane structure M.

Furthermore, the laminated structure 20 has a rectangular shape when viewed in the direction intersecting the main surface 20s. In the first step, the suction collet 100 is arranged such that the communication portion 135 is located at a position corresponding to each of the four corner portions of the rectangular shape of the laminated structure 20 in a state where the contact surface 133 is in contact with the bottom surface 34s. This makes it possible to achieve stable intake.

Furthermore, the plurality of openings 141 of the intake hole 140 is formed in the surface 112. In addition, in the first step, the suction collet 100 is arranged such that the plurality of openings 141 is symmetrically dispersed with respect to the center of the membrane structure M when viewed in the direction intersecting the main surface 20s. This makes it possible to achieve further stable suction and holding.

Modification Examples

The above embodiment has described one embodiment of the suction method according to one aspect of the present invention. Therefore, the suction method according to one aspect of the present invention is not limited to the method using the above-described suction collet 100, and may include a method using the above-described suction collet 100 modified in any manner. Subsequently, a modification of the suction collet will be described.

Figure 9:
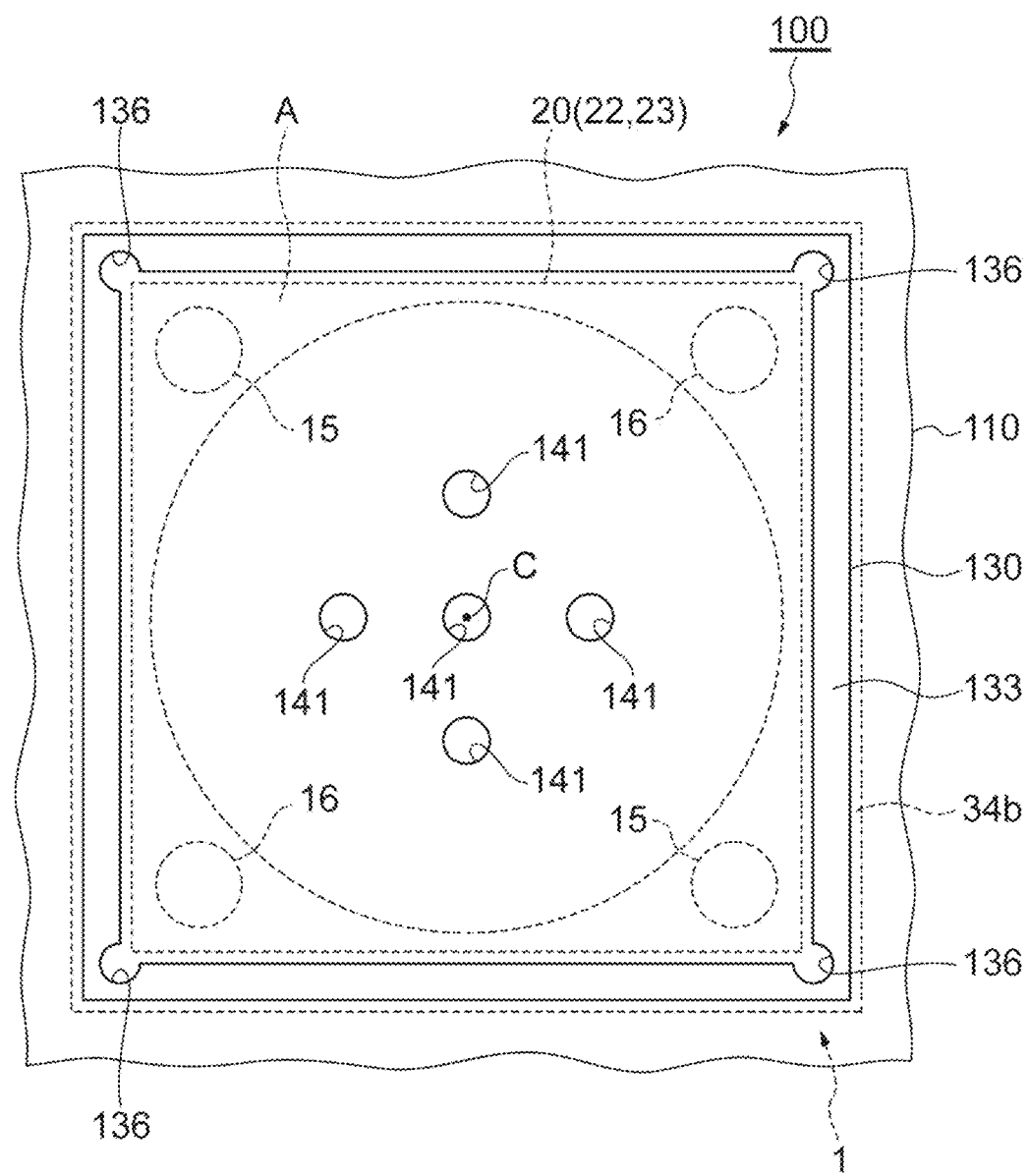
FIG. 9 is a schematic view illustrating a state in which the suction collet according to a modification suctions a Fabry-Perot interference filter.

FIG. 9 is a schematic view illustrating a state in which a suction collet according to a modification example suctions a Fabry-Perot interference filter. FIG. 9 is a bottom view (view from the surface 112 side), illustrating a portion of the Fabry-Perot interference filter broken lines in a simplified manner. As illustrated in FIG. 9, in this example, the contact portion 130 and the contact surface 133 are integrally formed so as to continuously surround the area A when viewed in the direction intersecting (orthogonal to) the surface 112. Here, the contact portion 130 and the contact surface 133 are formed in a rectangular ring shape so as to correspond to the thinned portion 34b when viewed in the direction intersecting (orthogonal to) the surface 112.

Furthermore, at each of corner portions of the contact portion 130 and the contact surface 133 (in this case, all four corner portions) are provided with a recess 136 that is recessed from the inner edge side to the outer edge side when viewed in the direction intersecting (orthogonal to) the surface 112. The recess 136 is arranged so as to correspond to the corner portion of the laminated structure 20 in the contact state. With the presence of the recess 136 in this manner, it is possible to reliably avoid contact with the corner portion of the laminated structure 20 when the contact portion 130 is disposed in the thinned portion 34b.

With the use of the suction method using the suction collet 100 according to the above modification example, the space R of intake is continuously surrounded by the contact portion 130, making it possible to achieve uniform intake within the space R regardless of the positions of the openings 141 of the intake hole 140. This improves the degree of freedom of the positions of the openings 141 of the intake hole 140. Accordingly, although the example of FIG. 9 arranges the plurality of openings 141 to be symmetrically dispersed with respect to the center C of the area A similarly to the case of FIG. 6, the number and positions of the openings 141 are not to be limited and can be set freely. For example, the number of the openings 141 may be one or in plurality, and the openings 141 may be arranged unevenly in area A. According to this modification example, the suction force can be increased without enhancing the air intake.

However, also in the suction collet according to the above-described embodiment, the position and the number of the openings 141 are not limited to the case of FIG. 6, and various modifications are possible.

Here, the above-described embodiment is an example of the thinned portion 34b illustrated as a thinned portion that is located outside the laminated structure and that is recessed to a side of the substrate with respect to the main surface. Furthermore, an exemplary mode has been described in which the contact surface 133 is in contact with the bottom surface 34s of the thinned portion 34b. However, the mode of contact between the thinned portion and the contact surface is not limited to this. For example, as illustrated in FIG. 3, the non-thinned portion 34a is also recessed to the substrate 11 side with respect to the main surface 20s. Therefore, for example, expanding the width of the non-thinned portion 34a to a degree sufficient to achieve the contact with the contact surface 133 enables the non-thinned portion 34a to be used as a thinned portion. In this case, the contact surface 133 would come into contact with the bottom surface (surface opposite to the substrate 11) of the non-thinned portion 34a. It is also conceivable that the non-thinned portion 34a alone is formed without formation of the thinned portion 34b. In this case, the non-thinned portion 34a would also be a thinned portion with which the contact surface 133 comes in contact. Furthermore, it is also allowable to have a configuration in which the thickness of the thinned portion 34b is zero, that is, the first surface 11a of the substrate 11 is exposed from the second laminate 24 without forming the thinned portion 34b. In this case, the exposed portion would be a thinned portion with which the contact surface 133 comes in contact. As described above, the mode of contact between the thinned portion and the contact surface can be variously modified.

Figure 10:
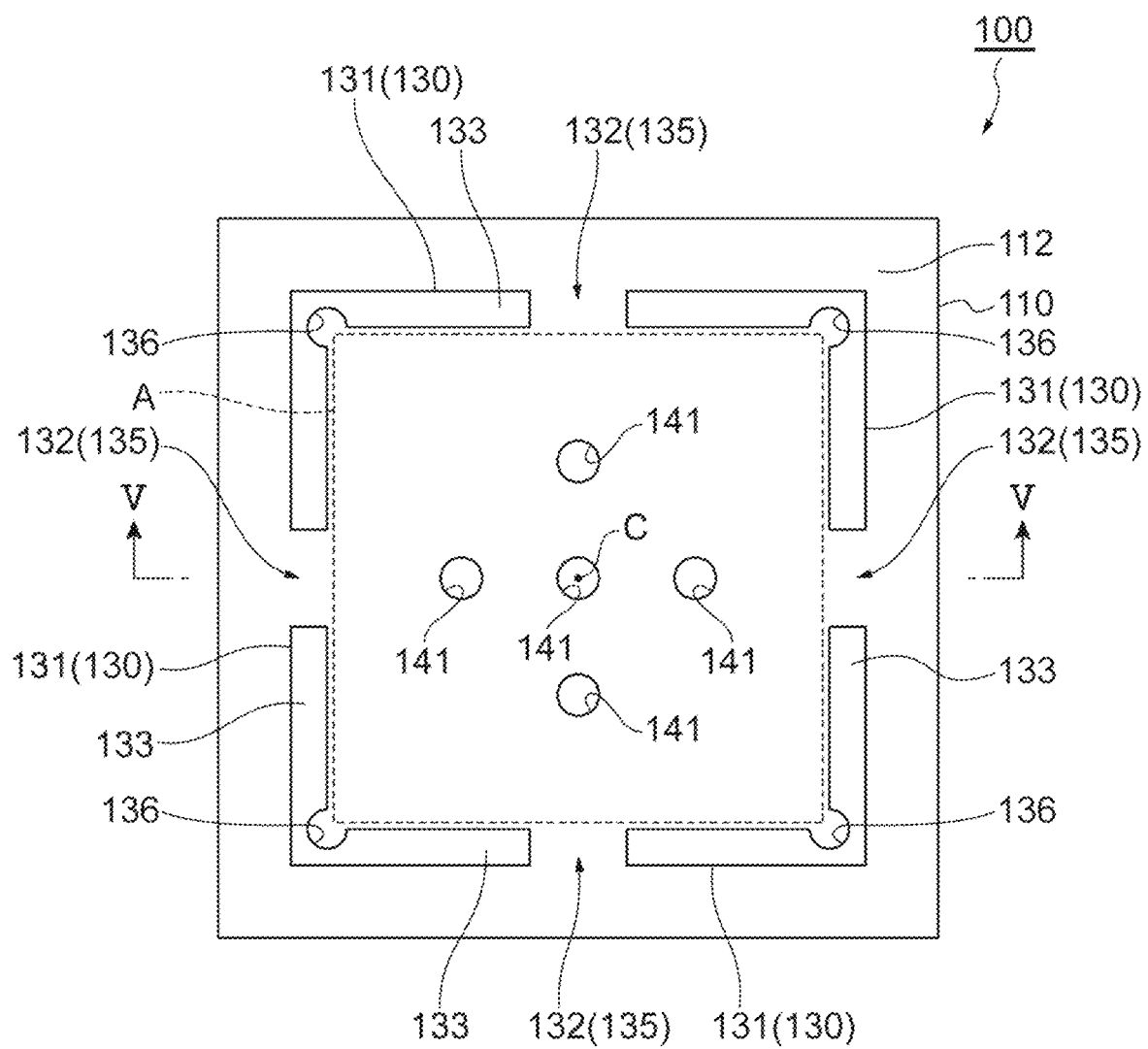
FIG. 10 is a bottom view illustrating a suction collet according to another modification.

FIG. 10 is a bottom view illustrating a suction collet according to another modification example. In the example of FIG. 10, the contact portion 130 includes a plurality of (four) portions 131 similarly to the example illustrated in FIG. 4. Each of the portions 131 is formed in an L-shape. Each of the portions 131 is arranged along a pair of sides of a rectangle of the area A and a corner connecting the pair of sides. At a corner portion of each of the portions 131 is provided with the recess 136 that is recessed from the inner edge side to the outer edge side when viewed in the direction intersecting (orthogonal to) the surface 112. The recess 136 is arranged so as to correspond to the corner portion of the laminated structure 20 in the contact state. With the presence of the recess 136 in this manner, it is possible to reliably avoid contact with the corner portion of the laminated structure 20 when the contact portion 130 is disposed in the thinned portion 34b. The gap 132 is formed between the portions 131. Here, the gap 132 is provided at a positions corresponding to each of four sides of the rectangle of the area A. Each of the gaps 132 functions as the communication portion 135 that allows the space R to communicate with the outside in the contact state. In this manner, the position (and number) of the communication portion 135 can be changed in any manner.

The above embodiment will be described as supplementary notes below.

[Supplementary Note 1]

A suction collet used for suction of a Fabry-Perot interference filter including: a substrate; a laminated structure that is provided on the substrate and that includes a main surface facing a side opposite to the substrate; and a thinned portion that is located outside the laminated structure when viewed in a direction intersecting the main surface and that is recessed to a side of the substrate with respect to the main surface, the suction collet including:

a main body having a surface and provided with an intake hole opening to the surface; and a contact portion provided on the surface so as to protrude from the surface and having a contact surface that comes in contact with a bottom surface of the thinned portion;

in which the laminated structure is provided with a membrane structure including a first mirror portion and a second mirror portion facing each other via a gap and in which a distance from each other is variable and including a portion of the main surface, the contact portion has a configuration in which a distance between the surface and the contact surface is greater than a distance between the main surface and the bottom surface and whereby a space is formed between the surface and the main surface in a state where the contact surface is in contact with the bottom surface, and the opening of the intake hole is formed in an area of the surface facing the space.

[Supplementary Note 2]

The suction collet according to supplementary note 1, in which the contact portion extends so as to surround the area when viewed in the direction intersecting the surface, and the contact portion includes a communication portion that allows the space to communicate with the outside in the state where the contact surface is in contact with the bottom surface.

[Supplementary Note 3]

The suction collet according to supplementary note 2, in which the contact portion is provide with a plurality of portions arranged to be spaced apart from each other so as to surround the area when viewed in the direction intersecting the surface, and the communication portion is formed by a gap between the portions.

[Supplementary Note 4]

The suction collet according to supplementary notes 2 or 3, in which the laminated structure is provided within electrode terminal that is located outside the membrane structure when viewed in the direction intersecting the main surface and that protrudes from the main surface, and the communication portion is provided at a position corresponding to the electrode terminal outside the electrode terminal in the state where the contact surface is in contact with the bottom surface.

[Supplementary Note 5]

The suction collet according to any one of supplementary notes 2 to 4, in which the laminated structure has a rectangular shape when viewed in the direction intersecting the main surface, and the communication portion is provided as a plurality of communication portions so as to each correspond to each of the four corner portions of the rectangular shape of the laminated structure in the state where the contact surface is in contact with the bottom surface.

[Supplementary Note 6]

The suction collet according to supplementary note 1, in which the contact portion is integrally formed so as to continuously surround the area when viewed in a direction intersecting the surface.

[Supplementary Note 7]

The suction collet according to any one of supplementary notes 1 to 6,
in which the surface is provided with a plurality of openings of the intake hole, and
the plurality of openings is arranged to be symmetrically dispersed with respect to a center of the area.

INDUSTRIAL APPLICABILITY

It is possible to provide a suction method capable of performing stable suction holding while suppressing breakage of a Fabry-Perot interference filter.

REFERENCE SIGNS LIST

1 Fabry-Perot interference filter
11 Substrate
15, 16 Terminal (electrode terminal)
20 Laminated structure
20s Main surface
31 First mirror portion
32 Second mirror portion
34b Thinned portion
34s Bottom surface
100 Suction collet
110 Main body
112 Surface
130 Contact portion
131 Portion
132 Gap
133 Contact surface
135 Communication portion
140 Intake hole
141 Opening
A Area
D1, D2 Distance
M Membrane structure
R Space

The invention claimed is:

1. A suction method of performing suction of a Fabry-Perot interference filter including: a substrate; a laminated structure that is provided on the substrate and that includes a main surface facing a side opposite to the substrate; and a thinned portion that is located outside the laminated structure when viewed in a direction intersecting the main surface and that is recessed to a side of the substrate with respect to the main surface, by using a suction collet,
the method comprising:
a first step of arranging the suction collet so as to face the main surface;
a second step of bringing the suction collet into contact with the Fabry-Perot interference filter after the first step; and
a third step of suctioning the Fabry-Perot interference filter by using the suction collet after the second step,
wherein the suction collet includes: a main body having a surface provided with an opening for air intake; and a contact portion that is provided on the surface so as to protrude from the surface and that includes a contact surface,
the laminated structure is provided with a membrane structure including a first mirror portion and a second mirror portion facing each other via a gap and in which a distance from each other is variable and including a portion of the main surface,
in the first step, the suction collet is arranged such that the contact surface faces a bottom surface of the thinned portion,
in the second step, the contact surface is brought into contact with the bottom surface while forming a space between the surface and the main surface, and
in the third step, an inside of the space is exhausted by the air intake through the opening.

2. The suction method according to claim 1,
wherein the contact portion extends so as to surround an area on the surface facing the space when viewed in a direction intersecting the surface,
the contact portion is provided with a communication portion that allows the space to communicate with an outside in a state where the contact surface is in contact with the bottom surface, and
in the third step, air is introduced into the space through the communication portion by the air intake through the opening.

3. The suction method according to claim 2,
wherein the contact portion includes a plurality of portions arranged to be spaced apart from each other so as to surround the area when viewed in the direction intersecting the surface, and
the communication portion is formed by a gap between the portions.

4. The suction method according to claim 2,
wherein the laminated structure includes an electrode terminal that is located outside the membrane structure when viewed in the direction intersecting the main surface and that protrudes from the main surface, and
in the first step, the suction collet is arranged such that the communication portion is located at a position corresponding to the electrode terminal outside the electrode terminal in the state where the contact surface is in contact with the bottom surface.

5. The suction method according to claim 2,
wherein the laminated structure has a rectangular shape when viewed in the direction intersecting the main surface, and
in the first step, the suction collet is arranged such that the communication portion is located at a position corresponding to each of four corner portions of the rectangular shape of the laminated structure in the state where the contact surface is in contact with the bottom surface.

6. The suction method according to claim 1,
wherein the contact portion is integrally formed so as to continuously surround an area on the surface facing the space when viewed in the direction intersecting the surface.

7. The suction method according to claim 1,
wherein a plurality of the openings is formed in the surface, and
in the first step, the suction collet is arranged such that the plurality of openings is symmetrically dispersed with respect to a center of the membrane structure when viewed in the direction intersecting the main surface.

* * * * *